US012744067B2

(12) United States Patent
Murugan et al.

(10) Patent No.: US 12,744,067 B2
(45) Date of Patent: Sep. 22, 2026

(54) CONTROL SIGNAL TRAINING

(71) Applicant: Cadence Design Systems, Inc., San Jose, CA (US)

(72) Inventors: Vinod Inipodu Murugan, San Jose, CA (US); Anirudha Shelke, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 59 days.

(21) Appl. No.: 18/874,378

(22) PCT Filed: Jun. 7, 2023

(86) PCT No.: PCT/US2023/024658
§ 371 (c)(1),
(2) Date: Dec. 12, 2024

(87) PCT Pub. No.: WO2023/244473
PCT Pub. Date: Dec. 21, 2023

(65) Prior Publication Data

US 2025/0372136 A1 Dec. 4, 2025

Related U.S. Application Data

(60) Provisional application No. 63/352,068, filed on Jun. 14, 2022.

(51) Int. Cl.
*G11C 8/18* (2006.01)

(52) U.S. Cl.
CPC .................................... *G11C 8/18* (2013.01)

(58) Field of Classification Search
CPC ........... G11C 7/222; G11C 7/225; G11C 8/18; G11C 29/36
See application file for complete search history.

(56) References Cited

U.S. PATENT DOCUMENTS

2006/0224339 A1* 10/2006 Kim ...................... H04L 7/0083 702/66
2014/0195728 A1 7/2014 Hsu et al.
2017/0110165 A1* 4/2017 Kim ..................... G11C 7/1072

(Continued)

OTHER PUBLICATIONS

International Search Report dated Oct. 2, 2023 issued in PCT/US23/24658.

*Primary Examiner* — Han Yang
(74) *Attorney, Agent, or Firm* — Mark H. Whittenberger; Holland & Knight LLP

(57) ABSTRACT

A controller iteratively activates a control signal for one-half a clock cycle while sweeping its phase relationship to the rising edge of the clock. Phase relationships that result in the rising edge of the clock occurring while the control signal is active result in the memory device outputting command/address data on the data bus. Phase relationships that do not result in the rising edge of the clock occurring while the control signal is active do not result in the memory device outputting the command/address data on the data bus. By changing the data on the CA bus between activations of the control signal, the controller can ascertain what phase relationships result in the control signal being successfully sampled. From this information, the controller can select a reliable setting for the phase relationship between the control signal and the clock signal.

20 Claims, 8 Drawing Sheets

(56) References Cited

U.S. PATENT DOCUMENTS

| | | | | |
|---|---|---|---|---|
| 2018/0090186 | A1* | 3/2018 | Kang | H03L 7/091 |
| 2020/0019207 | A1 | 1/2020 | Rajwani et al. | |
| 2020/0381075 | A1 | 12/2020 | Kim et al. | |
| 2021/0319818 | A1 | 10/2021 | Shin et al. | |

* cited by examiner

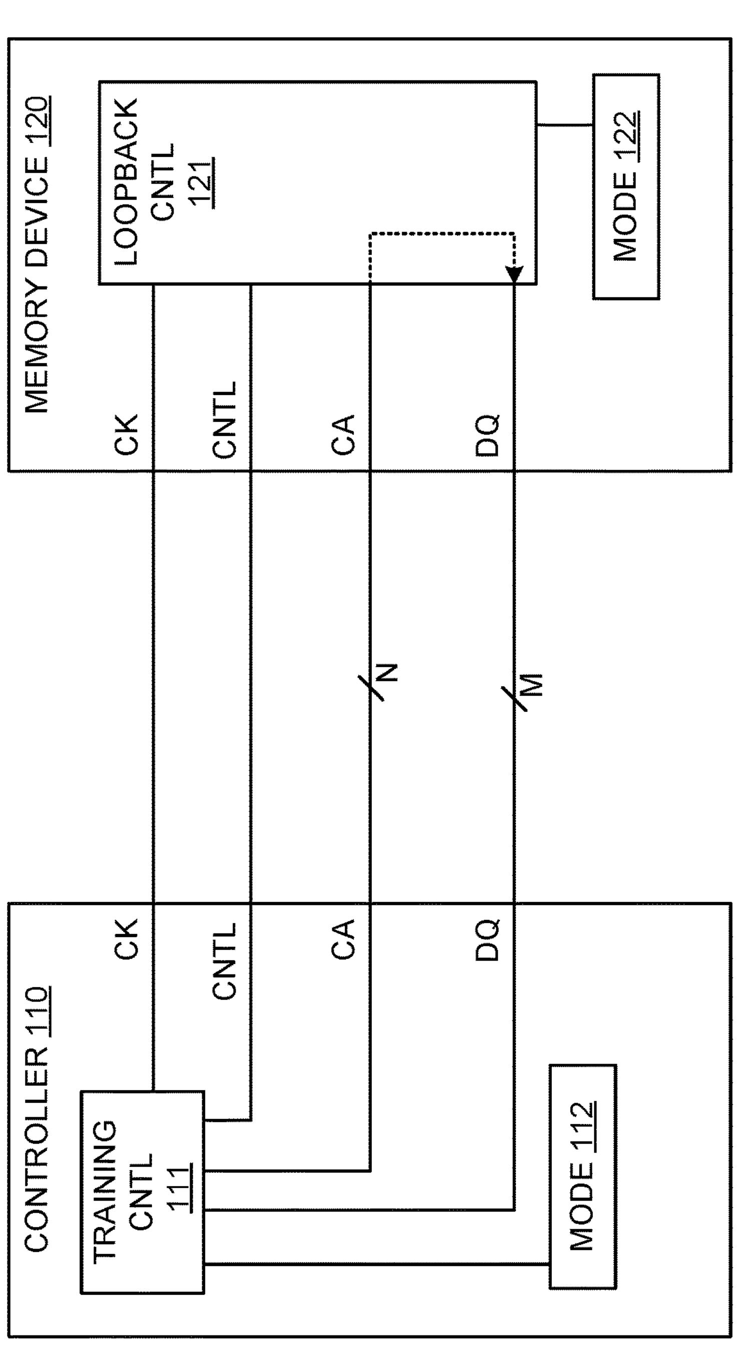
FIG. 1

*FIG. 3*

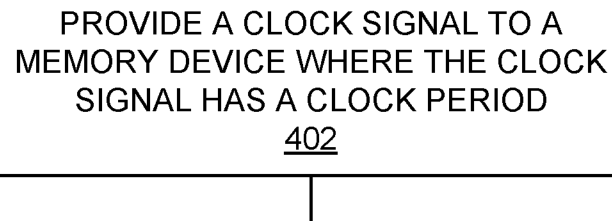

PROVIDE A PLURALITY OF DATA PATTERNS TO A MEMORY DEVICE COMMAND/ADDRESS INTERFACE OF THE MEMORY DEVICE
404

PROVIDE A CONTROL SIGNAL TO A MEMORY DEVICE CONTROL SIGNAL INTERFACE OF THE MEMORY DEVICE
406

TRANSMIT, TO THE MEMORY DEVICE, A PLURALITY OF ACTIVATIONS OF THE CONTROL SIGNAL, EACH ACTIVATION OF THE PLURALITY OF ACTIVATIONS HAVING ONE OF A PLURALITY OF PHASE RELATIONSHIPS TO THE CLOCK SIGNAL, THE PLURALITY OF ACTIVATIONS OF THE CONTROL SIGNAL TO BE ACTIVATED FOR TIME PERIODS THAT ARE LESS THAN THE CLOCK PERIOD, A FIRST SUBSET OF THE PLURALITY OF ACTIVATIONS OF THE CONTROL SIGNAL TO CAUSE THE MEMORY DEVICE TO TRANSMIT DATA PATTERNS RECEIVED VIA THE MEMORY DEVICE COMMAND/ADDRESS INTERFACE TO THE MEMORY CONTROLLER, A SECOND SUBSET OF THE PLURALITY OF ACTIVATIONS OF THE CONTROL SIGNAL TO NOT CAUSE THE MEMORY DEVICE TO TRANSMIT DATA PATTERNS
408

BASED ON THE FIRST SUBSET AND THE SECOND SUBSET, SELECT AN OPERATING PHASE RELATIONSHIP BETWEEN THE CLOCK SIGNAL AND THE CONTROL SIGNAL
410

*FIG. 4*

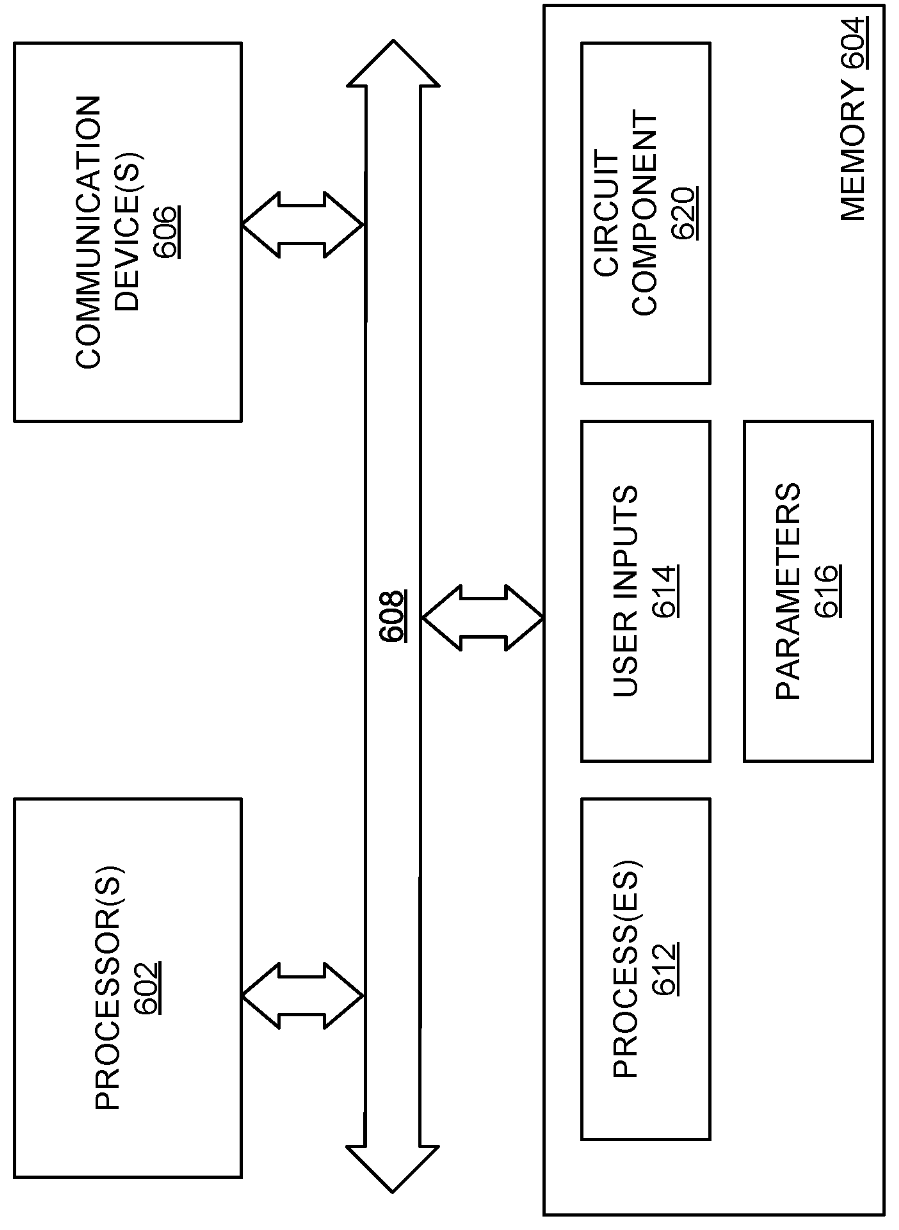
COMMUNICATION DEVICE(S) 606
PROCESSOR(S) 602
608
CIRCUIT COMPONENT 620
USER INPUTS 614
PARAMETERS 616
PROCESS(ES) 612
MEMORY 604
FIG. 6
600

CONTROL SIGNAL TRAINING

CROSS-REFERENCE TO RELATED APPLICATIONS

This application is a U.S. National Stage of International Patent Application No. PCT/US2023/024658, filed on 7 Jun. 2023, claiming the benefit of U.S. Provisional Application Ser. No. 63/352,068, filed on 14 Jun. 2022. The disclosures of which are incorporated herein by reference in their entirety.

BRIEF DESCRIPTION OF THE DRAWINGS

FIG. 1 is a block diagram of a memory system.

FIG. 3 is a flowchart illustrating a training method for a memory system.

FIG. 4 is a flowchart illustrating a method of selecting a timing for a control signal.

FIG. 6 is a block diagram of a processing system.

DETAILED DESCRIPTION OF THE EMBODIMENTS

Figure 2A:
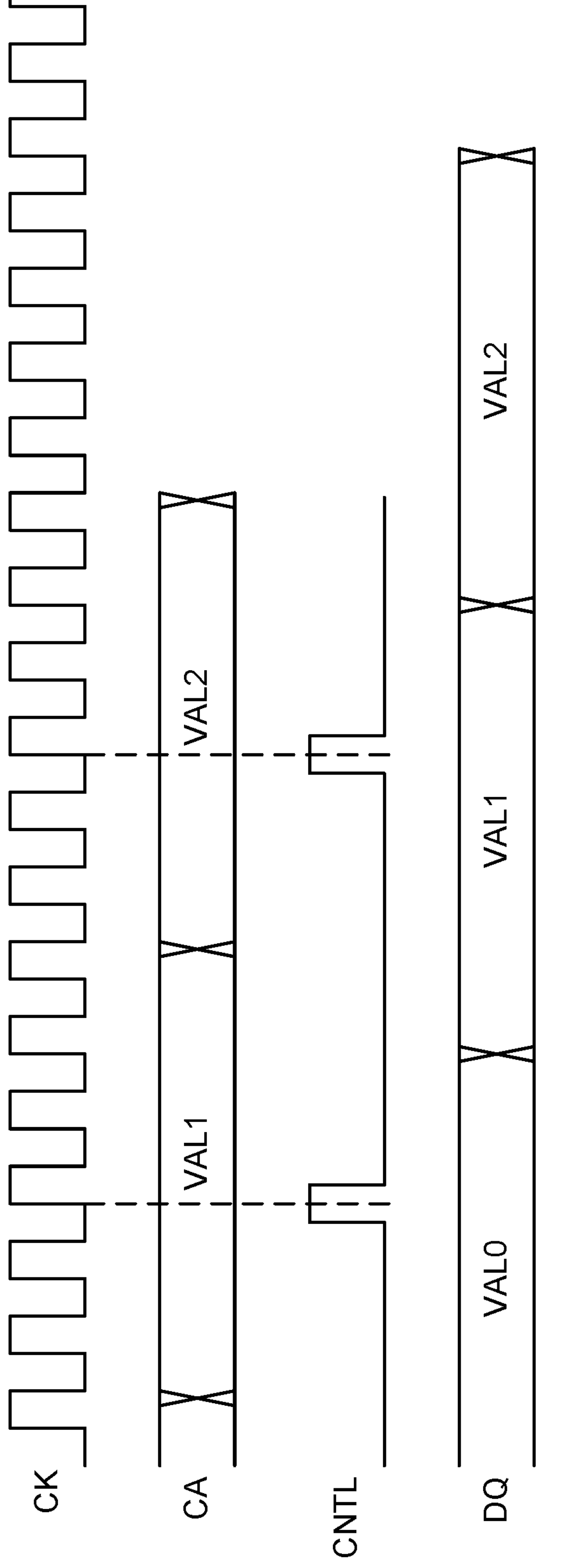
FIGS. 2A-2C are timing diagrams illustrating a training sequence.

In an embodiment, a memory controller is operatively coupled to a memory device (e.g., a device that conforms to the Graphics Double Data Rate 6 standard—GDDR6). The memory device may be placed in a training mode whereby, upon the sampling of a control signal (e.g., clock enable—CKE) on the rising edge of a clock (e.g., CK) by the memory device causes the memory device to output, on the data bus (DQ) the signals it just sampled on the command/address (CA) bus. This allows the controller to adjust the timings of the signals on the CA bus for reliable operation.

In an embodiment, the timing of the control signal is adjusted for reliable operation. In particular, the controller activates the control signal for less than a full clock cycle (e.g., ½ clock cycle) while sweeping its phase relationship to the rising edge of the clock. Phase relationships that result in the rising edge of the clock occurring while the control signal is active result in the memory device outputting the CA data on the DQ bus. Phase relationships that do not result in the rising edge of the clock occurring while the control signal is active do not result in the memory device outputting the CA data on the DQ bus. Thus, by changing the data on the CA bus between activations of the control signal, the controller can ascertain what phase relationships (i.e., range) result in the control signal being successfully sampled. From this information, the controller can select a reliable setting (e.g., middle of the range) for the phase relationship between the control signal and the clock signal.

FIG. 1 is a block diagram of a memory system. In FIG. 1, memory system 100 comprises memory controller 110 and memory device 120. Controller 110 includes training control circuitry and mode circuitry 112. Memory device 120 includes loopback control circuitry 121 and mode circuitry 122. Controller 110 is operatively coupled to memory device 120. In particular, controller 110 is operatively coupled to memory device via a clock signal (CK), a control signal (CNTL), a command address bus (CA), and a data bus (DQ). The CA bus includes N number of signals and the DQ bus includes M number of signals where M≥N.

Controller 110 and memory device 20 are integrated circuit type devices, such as ones commonly referred to as a "chips". A controller, such as controller 110, manages the flow of data going to and from memory devices, such as memory device 120. For example, a controller may be a northbridge chip, an application specific integrated circuit (ASIC) device, a load-reduction memory buffer, a graphics processor unit (GPU), a system-on-chip (SoC) or an integrated circuit device that includes many circuit blocks such as ones selected from graphics cores, processor cores, and MPEG encoder/decoders, etc.

Although a single memory device 120 is shown, there may be multiple memory devices or chips disposed on a memory module and coupled to the controller via a connector interface. Memory device 120 can include a dynamic random access memory (DRAM) core or other type of memory cores, for example, static random access memory (SRAM) cores, or non-volatile memory cores such as flash. Controller 110 and memory device 120 may be interconnected with each other in a variety of system topologies including on a PC board (e.g., where the memory is on a module and the controller is socketed to the PC board, or in "die-down" arrangement where one or both of the chips are soldered to the PC board), stacked one on top of another and encapsulated in a single package or each having separate package (package-on-package), both disposed on a shared substrate, on an interposer, or even in a direct-attach arrangement. In addition, although the embodiments presented herein describe controller and one or more memory devices, the instant apparatus and methods may also apply to chip interfaces that effectuate signaling between separate integrated circuit devices.

The control signal CNTL may be, or correspond to, for example, the clock enable (CKE) signal of the GDDR6 standard. In other examples, the CNTL may be, correspond to, and/or function as, for example, other control signals such as chip select (CS), on-die termination enable (ODT), etc. of the GDDR6 and/or other standards (e.g., DDR5, etc.). In addition, control signal CNTL may have additional or multiple functionalities such as carrying out both the chip select and clock enable functions.

In an embodiment, the signal output by the CK interface of controller 110 and received by the CK interface of memory device 120 is periodic at a stable frequency. Because CK is periodic, CK may be referred to as a clock signal and its period referred to as a clock period. The CNTL signal is output by the CNTL interface of controller 110 and received by the CNTL interface of memory device 120. The CA bus signals are output by the CA interface of controller 110 and received by the CA interface of memory device 120. The DQ bus signals may be output by the DQ interface of controller 110 or the DQ interface of memory device 120 and received by the DQ interface of memory device 120 or the DQ interface of controller 110, respectively (i.e., DQ bus and interfaces are bidirectional).

In an embodiment, CNTL is sampled by memory device 120 on the rising edge of CK. When in a training mode (e.g., set by mode circuitry 112), when memory device 120 receives CNTL in an inactivated (e.g., logical "0") state on the rising edge of CK, followed by memory device 120 receiving CNTL in an activated (e.g., logical "1") state on the next rising edge of CK, memory device 120 samples the CA bus signals memory device 120 is receiving (timed by the rising edge of CK). The sampled CA bus signals are then placed on the DQ bus (e.g., by loopback control circuitry 121 as controlled by mode circuitry 122). Mode circuitry 122 is configured by controller 110 (e.g., by a mode register set command-MRS). Mode circuitry 122 is configured by controller 110 to enable the loopback of the signals on the CA bus to the DQ bus in response to the activated state on CNTL during the rising edge of the CK signal.

In an embodiment, the clock interface of controller 110 transmits a clock signal having a clock period. The CA interface of controller 110 transmits, to the CA interface of memory device 120, at least a first data pattern and a second data pattern. In an embodiment, controller 110 repeatedly transmits and holds the first data pattern, activates the CNTL signal, deactivates the CNTL signal, transmits and holds the second data pattern, activates the CNTL signal, deactivates the CNTL signal, and the goes back to transmitting and holding the first data pattern, and so on. When activating CNTL, the control signal interface of controller 110 repeatedly transmits, to the control signal interface of memory device 120, the active state of CNTL for a first period of time that is less than the full clock period. In an embodiment, the first period of time is substantially one-half the clock period. In an embodiment, the first data pattern and the second data pattern are transmitted at least one clock cycle before the control signal CNTL transitions from the inactive state to the active state.

The transitions from the inactive state of CNTL to the active state of CNTL have various phase relationships to the rising edge of the clock signal CK. As described herein, CNTL is sampled by memory device 120 on the rising edge of the clock signal CK. Sampling of the control signal CNTL by memory device 120 in the active state causes memory device 120 to provide the received (i.e., sampled) data patterns to controller 110 via the DQ bus. Sampling of the control signal CNTL by memory device 120 in the inactive state causes memory device 120 to not sample and then provide new data patterns to controller 110 via the DQ bus.

In an embodiment, training control circuitry 111 adjusts the phase relationship between the clock signal CK and the control signal CNTL through a plurality of phase relationships (e.g., sweeps the phase relationship). Training control circuitry 111, based on the received data patterns provided to the controller 110 by memory device 120 via the DQ bus, determines a phase relationship between CNTL and CK setting for the transitions from the inactive state to the active state. In an embodiment, once training control circuitry 111 has set phase relationship between CNTL and CK, training control circuitry may proceed to adjust (i.e., train) the phase relationships of the CA bus signals to the clock signal CK while controller 110 is using the phase relationship it determined for control signal CNTL.

Figure 2B:
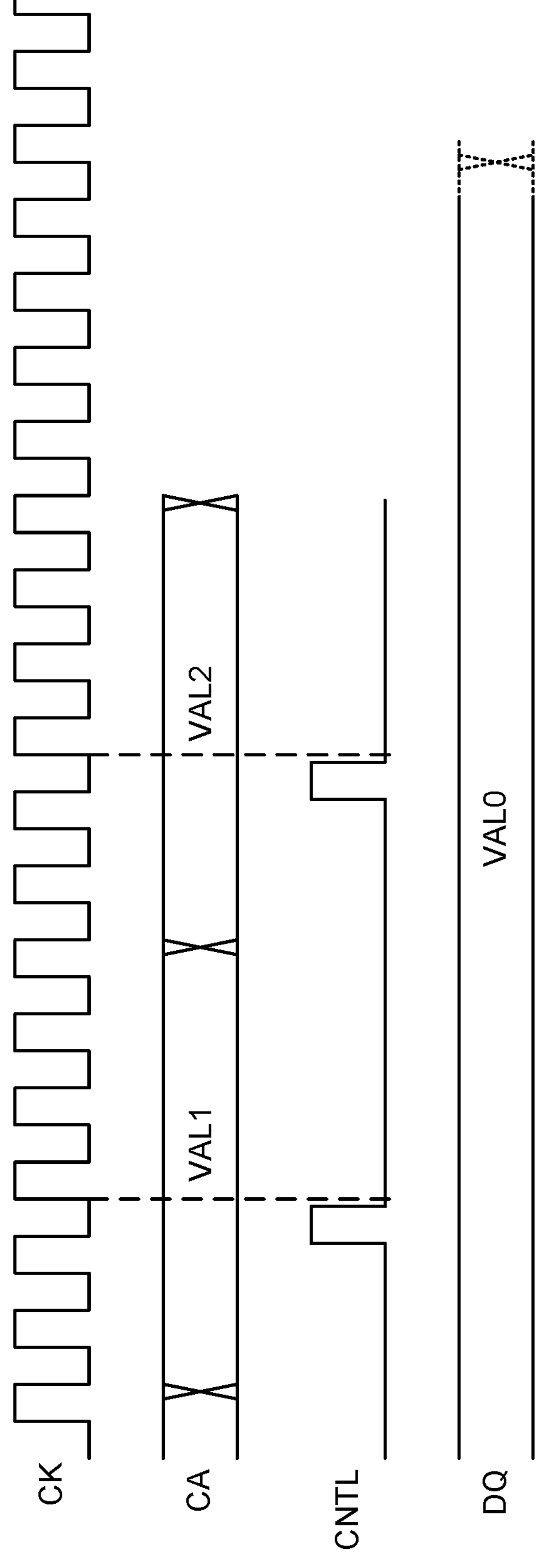
Figure 2C:
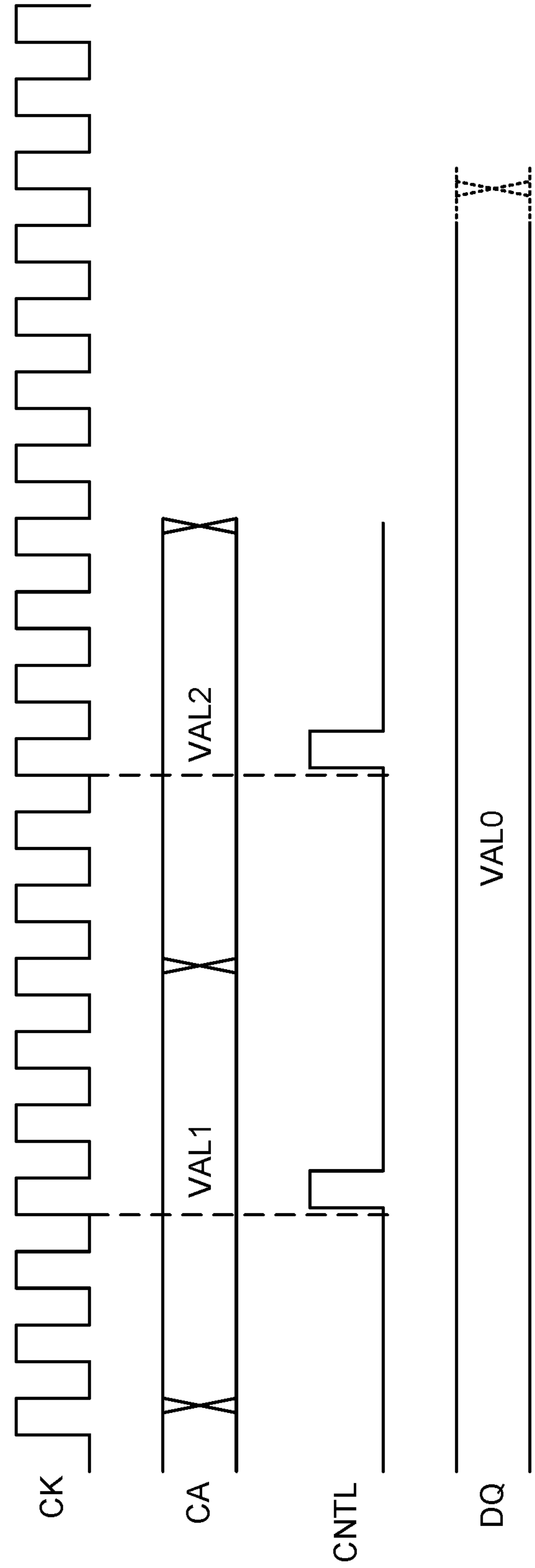

FIGS. 2A-2C are timing diagrams illustrating a training sequence. In FIG. 2A, the rising edge of CK occurs approximately at the midpoint of the ½ clock period CNTL activation pulse. Thus, in FIG. 2A, the data patterns (VAL1, VAL2) on the CA bus are correctly captured by memory device 120 and then reflected a short time later on the DQ bus. In FIG. 2B, the rising edge of CK occurs after the ½ clock period CNTL activation pulse. Thus, in FIG. 2B, the data patterns (VAL1, VAL2) on the CA bus are not correctly captured by memory device 120 so that the previous pattern (e.g., VAL0) is remains on the DQ bus. In an embodiment, VAL0 may be one of VAL1 and VAL2. Typically, VAL1 is not equal to VAL2 (or any other additional values transmitted—i.e., VAL0≠VAL1≠VAL2≠VAL3≠ . . . ) In FIG. 2C, the rising edge of CK occurs before the ½ clock period CNTL activation pulse. Thus, in FIG. 2C, the data patterns (VAL1, VAL2) on the CA bus are not correctly captured by memory device 120 so that the previous pattern (e.g., VAL0) is remains on the DQ bus. Accordingly, as can be seen from FIGS. 2A-2C, training control circuitry 111 may sweep the phase relationship of the ½ clock period activation pulse with respect to the rising edge of the clock in order to determine the boundaries of the ½ clock cycle CNTL activation pulse with respect to the rising edge of CK. Once the boundaries of the ½ clock CNTL activation cycle pulse are determined with respect the rising edge of the clock, a phase relationship setting for a one (i.e., whole) clock cycle CNTL activation pulse may be determined from those boundaries. This phase relationship may be a phase setting that “centers” the rising edge of CK within the CNTL activation pulse. In an embodiment, where $t_{CK}$ is the clock period, the phase relationship setting ($t_{center}$) between CK and CNTL that “centers” the rising edge of CK within the CNTL activation pulse is $t_{center}=((t_R-t_L)/2)-0.25t_{CK}$, where $t_R$ is the right boundary setting and $t_L$ is the left boundary setting. It should be understood that $t_{CK}$ in this formula may not be fixed. In some embodiments, $t_{CK}$ in this “centering” formula may be changed based on other system factors such as the pulse with of the CNTL activation pulse during training.

Figure 3:
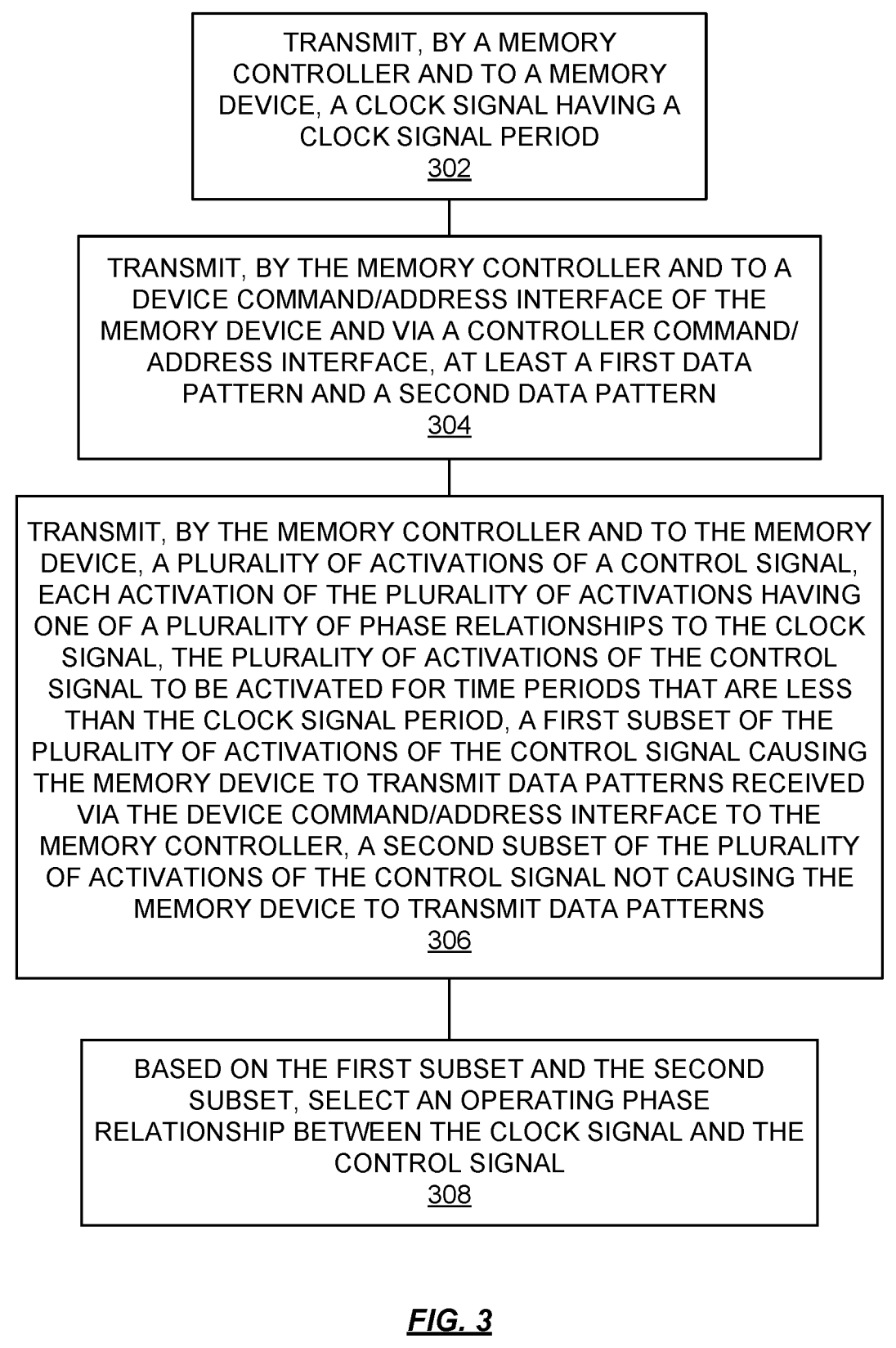

FIG. 3 is a flowchart illustrating a training method for a memory system. One or more steps illustrated in FIG. 3 may be performed by, for example, memory system 100, and/or its components. By a controller and to a memory device, a clock signal having a clock signal period is transmitted (302). For example, controller 110 may transmit a periodic clock signal CK having a clock period to memory device 120.

By the controller and to a device command/address interface of the memory device and via a controller command/address interface, at least a first data pattern and a second data pattern are transmitted (304). For example, controller 110, via controller 110's CA bus interface, may transmit and hold the first data pattern (e.g., VAL1), pulse the CNTL signal, transmit and hold the second data pattern (e.g., VAL2), pulse the CNTL signal, and then go back to transmitting and holding the first data pattern (or a third data pattern, etc.), and so on.

By the controller and to the memory device, a plurality of activations of a control signal are transmitted, each activation of the plurality of activations having one of a plurality of phase relationships to the clock signal, the plurality of activations of the control signal to be activated for time periods that are less than the clock signal period, a first subset of the plurality of activations of the control signal causing the memory device to transmit data patterns received via the device command/address interface to the controller, a second subset of the plurality of activations of the control signal not causing the memory device to transmit data patterns (306). For example, controller 110 may, while driving various data patterns (e.g., VAL1, VAL2, etc.), controller 110 may pulse CNTL active for ½ a clock cycle with various (e.g., swept) timings relative to the rising edge of CK. When a given timing results in the rising edge of CK occurring while CNTL is active, the data patterns (VAL1, VAL2) on the CA bus are correctly captured by memory device 120 and then reflected a short time later on the DQ bus where the data patterns are sampled by controller 110. When a given timing results in the rising edge of CK not occurring while CNTL is active, the data patterns (VAL1, VAL2) on the CA bus are not correctly captured by memory device 120 and then reflected a short time later on the DQ bus and the data patterns that are sampled by controller 110 are not correct (e.g., VAL1 and VAL2).

Based on the first subset and the second subset, an operating phase relationship between the clock signal and the control signal is selected (308). For example, the first subset (successfully sampling CNTL while it is active) and the second subset (not successfully sampling CNTL while it is active) allow the boundaries (i.e., timings or phase relationships) of the ½ clock cycle CNTL activation pulse with respect to the rising edge of CK to be determined. Once the boundaries of the ½ clock CNTL activation cycle pulse are determined with respect the rising edge of the clock, a phase relationship setting for a one (i.e., whole) clock cycle CNTL activation pulse may be determined from those boundaries. This phase relationship may be a phase setting that "centers" the rising edge of CK within the CNTL activation pulse. In an embodiment, where $t_{CK}$ is the clock period, the phase relationship setting ($t_{center}$) between CK and CNTL that "centers" the rising edge of CK within the CNTL activation pulse is tcenter=$((t_R-t_L)/2)-0.25t_{CK}$, where $t_R$ is the right boundary setting and $t_L$ is the left boundary setting.

FIG. 4 is a flowchart illustrating a method of selecting a timing for a control signal. One or more steps illustrated in FIG. 4 may be performed by, for example, memory system 100, and/or its components. A clock signal is provided to a memory device where the clock signal has a clock period (402). For example, controller 110 may transmit a periodic clock signal CK having a clock period to memory device 120.

A plurality of data patterns are provided to a memory device command/address interface of the memory device (404). For example, controller 110, via memory device 120's CA bus interface, may transmit and hold the first data pattern (e.g., VAL1), pulse the CNTL signal, transmit and hold the second data pattern (e.g., VAL2), pulse the CNTL signal, and then go back to transmitting and holding the first data pattern (or a third data pattern, etc.), and so on. A control signal is provided to a memory device control signal interface of the memory device (406). For example, controller 110 may provide, to the CNTL signal interface of memory device 120, an inactive CNTL signal.

To the memory device, a plurality of activations of the control signal are transmitted where each activation of the plurality of activations has one of a plurality of phase relationships to the clock signal. The plurality of activations of the control signal being activated for time periods that are less than the clock period. A first subset of the plurality of activations of the control signal to cause the memory device to transmit data patterns received via the memory device command/address interface to the controller. A second subset of the plurality of activations of the control signal to not cause the memory device to transmit data patterns (408). For example, controller 110 may, while driving various data patterns (e.g., VAL1, VAL2, etc.), controller 110 may pulse CNTL active for ½ a clock cycle with various (e.g., swept) timings relative to the rising edge of CK. When a given timing results in the rising edge of CK occurring while CNTL is active, the data patterns (VAL1, VAL2) on the CA bus are correctly captured by memory device 120 and then reflected a short time later on the DQ bus where the data patterns are sampled by controller 110. When a given timing results in the rising edge of CK not occurring while CNTL is active, the data patterns (VAL1, VAL2) on the CA bus are not correctly captured by memory device 120 and then reflected a short time later on the DQ bus and the data patterns that are sampled by controller 110 are not correct (e.g., VAL1 and VAL2).

Based on the first subset and the second subset, an operating phase relationship between the clock signal and the control signal is selected (410). For example, the first subset (successfully sampling CNTL while it is active) and the second subset (not successfully sampling CNTL while it is active) allow the boundaries (i.e., timings or phase relationships) of the ½ clock cycle CNTL activation pulse with respect to the rising edge of CK to be determined. Once the boundaries of the ½ clock CNTL activation cycle pulse are determined with respect the rising edge of the clock, a phase relationship setting for a one (i.e., whole) clock cycle CNTL activation pulse may be determined from those boundaries. This phase relationship may be a phase setting that "centers" the rising edge of CK within the CNTL activation pulse. In an embodiment, where $t_{CK}$ is the clock period, the phase relationship setting ($t_{center}$) between CK and CNTL that "centers" the rising edge of CK within the CNTL activation pulse is tcenter=$((t_R-t_L)/2)-0.25t_{CK}$, where $t_R$ is the right boundary setting and $t_L$ is the left boundary setting.

Figure 5:
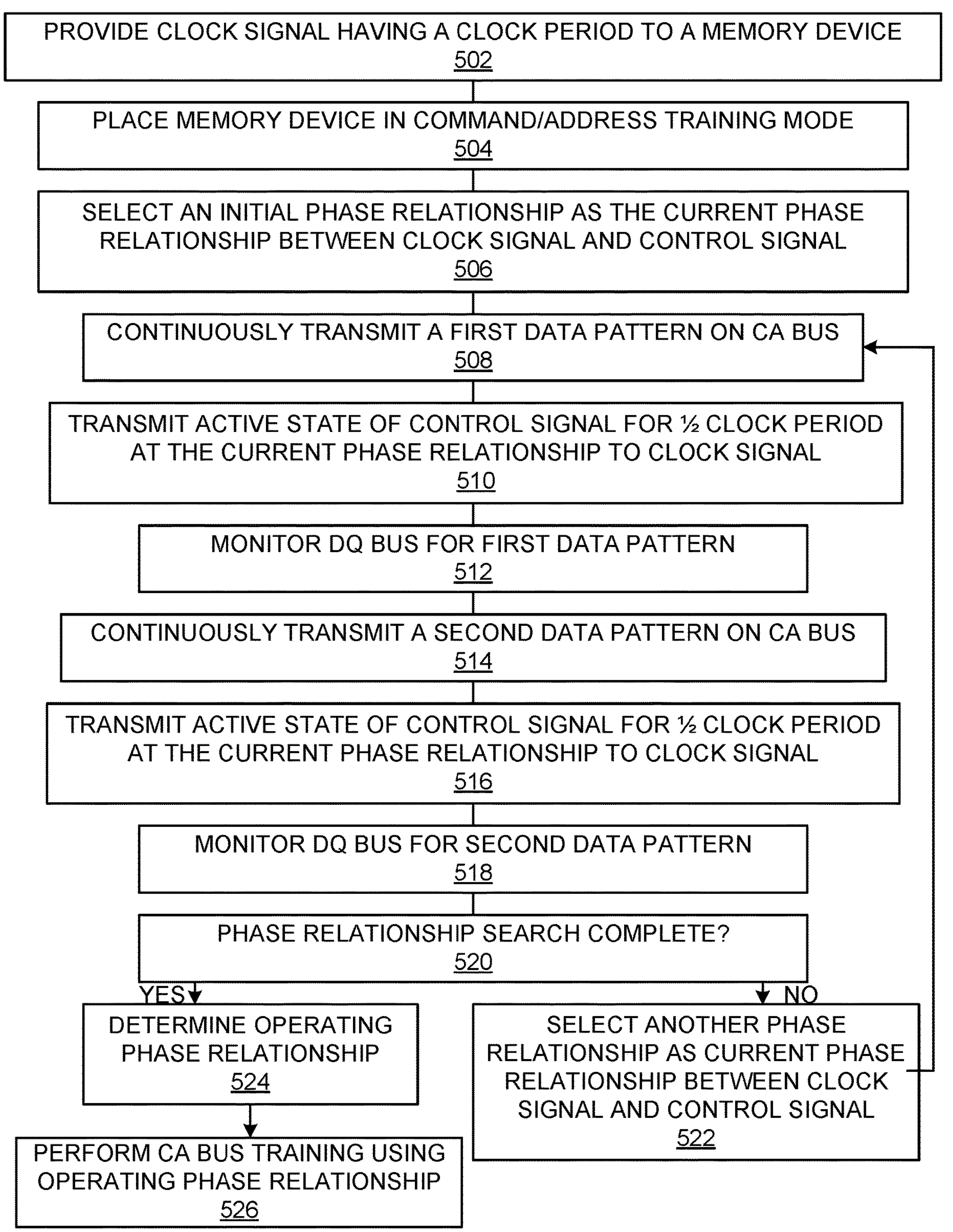
FIG. 5 is a flowchart illustrating a method of calibrating a command/address bus.

FIG. 5 is a flowchart illustrating a method of calibrating a command/address bus. One or more steps illustrated in FIG. 5 may be performed by, for example, memory system 100, and/or its components. A clock signal having a clock period is provided to a memory device (502). For example, controller 110 may transmit a periodic clock signal CK having a clock period to memory device 120. The memory device is placed in command/address training mode (504). For example, mode circuitry 122 may be configured by controller 110 (e.g., by a mode register set command—MRS). Mode circuitry 122 may be configured by controller 110 to enable the loopback of the signals on the CA bus to the DQ bus in response to the activated state on CNTL during the rising edge of the CK signal.

An initial phase relationship is selected as the current phase relationship between the clock signal and the control signal (506). For example, training control circuitry 111 may select an initial phase relationship between CNTL and CK. This initial phase relationship may be, for example, a phase relationship that is known to be too early (or too late) to have the activation pulse on CNTL captured by memory device 120.

A first data pattern is continuously transmitted on the CA bus (508). For example, controller 110, via controller 110's CA bus interface, may transmit and hold a first data pattern (e.g., VAL1). The active state of the control signal is transmitted for ½ a clock period at the current phase relationship to the clock signal (510). For example, controller 110 may pulse CNTL active for ½ a clock cycle at the currently selected phase relationship to CK. The DQ bus is monitored for the first data pattern (512). For example, when a given phase relationship results in the rising edge of CK occurring while CNTL is active, the first data patterns (VAL1) on the CA bus is correctly captured by memory device 120 and then reflected a short time later on the DQ bus where the data patterns are sampled by controller 110. When a given timing results in the rising edge of CK not occurring while CNTL is active, the first data patterns (VAL1) on the CA bus is not correctly captured by memory device 120 and then reflected a short time later on the DQ bus.

A second data pattern is continuously transmitted on the CA bus (514). For example, controller 110, via controller 110's CA bus interface, may transmit and hold a second data pattern (e.g., VAL2). The active state of the control signal is transmitted for ½ a clock period at the current phase relationship to the clock signal (516). For example, controller 110 may pulse CNTL active for ½ a clock cycle at the currently selected phase relationship to CK. The DQ bus is monitored for the second data pattern (518). For example, when a given phase relationship results in the rising edge of CK occurring while CNTL is active, the second data patterns (VAL2) on the CA bus is correctly captured by memory device 120 and then reflected a short time later on the DQ bus where the data patterns are sampled by controller 110. When a given timing results in the rising edge of CK not occurring while CNTL is active, the second data patterns (VAL2) on the CA bus is not correctly captured by memory device 120 and then reflected a short time later on the DQ bus.

It is determined whether the phase relationship search is complete (520). If the phase relationship search is complete, flow proceeds to box 524. If the phase relationship is not complete, flow proceeds to box 522. For example, if all of the phase relationship settings over a selected range of phase relationship settings have been tried, and/or if the boundaries (i.e., timings or phase relationships) of the ½ clock cycle CNTL activation pulse with respect to the rising edge of CK have been determined, training control circuitry 111 may conclude that the phase relationship search is complete.

If the phase relationship search is complete, an operating phase relationship is determined (524). For example, once the boundaries of the ½ clock CNTL activation cycle pulse are determined with respect the rising edge of the clock, a phase relationship setting for a one (i.e., whole) clock cycle CNTL activation pulse may be determined from those boundaries. This phase relationship may be a phase setting that "centers" the rising edge of CK within the CNTL activation pulse. In an embodiment, where $t_{CK}$ is the clock period, the phase relationship setting ($t_{center}$) between CK and CNTL that "centers" the rising edge of CK within the CNTL activation pulse is $tcenter=((t_R-t_L)/2)-0.25t_{CK}$, where $t_R$ is the right boundary setting and $t_L$ is the left boundary setting. After determining an operating phase relationship, CA bus training may be performed while using the operating phase relationship (526). For example, controller 110 may perform CA bus training while activating the CNTL signal at the phase relationship that "centers" the rising edge of CK within the CNTL activation pulse.

If the phase relationship search is not complete, another phase relationship is selected as the current phase relationship between the clock signal and the control signal (522). For example, another step (e.g., increment or decrement) of the phase settings may be selected as the current phase settings. Flow then proceeds to box 508.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of memory system 100 and its components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

FIG. 6 is a block diagram illustrating one embodiment of a processing system 600 for including, processing, or generating, a representation of a circuit component 620. Processing system 600 includes one or more processors 602, a memory 604, and one or more communications devices 606. Processors 602, memory 604, and communications devices 606 communicate using any suitable type, number, and/or configuration of wired and/or wireless connections 608.

Processors 602 execute instructions of one or more processes 612 stored in a memory 604 to process and/or generate circuit component 620 responsive to user inputs 614 and parameters 616. Processes 612 may be any suitable electronic design automation (EDA) tool or portion thereof used to design, simulate, analyze, and/or verify electronic circuitry and/or generate photomasks for electronic circuitry. Representation 620 includes data that describes all or portions of memory system 100 its components, as shown in the Figures.

Representation 620 may include one or more of behavioral, register transfer, logic component, transistor, and layout geometry-level descriptions. Moreover, representation 620 may be stored on storage media or communicated by carrier waves.

Data formats in which representation 620 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 614 may comprise input parameters from a keyboard, mouse, voice recognition interface, microphone and speakers, graphical display, touch screen, or other type of user interface device. This user interface may be distributed among multiple interface devices. Parameters 616 may include specifications and/or characteristics that are input to help define representation 620. For example, parameters 616 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 604 includes any suitable type, number, and/or configuration of non-transitory computer-readable storage media that stores processes 612, user inputs 614, parameters 616, and circuit component 620.

Communications devices 606 include any suitable type, number, and/or configuration of wired and/or wireless devices that transmit information from processing system 600 to another processing or storage system (not shown) and/or receive information from another processing or storage system (not shown). For example, communications devices 606 may transmit circuit component 620 to another system. Communications devices 606 may receive processes 612, user inputs 614, parameters 616, and/or circuit component 620 and cause processes 612, user inputs 614, parameters 616, and/or circuit component 620 to be stored in memory 604.

Implementations discussed herein include, but are not limited to, the following examples:

Example 1: A controller, comprising: a clock interface to transmit a clock signal having a clock period; a controller command/address interface to transmit, to a memory device command/address interface of a memory device, at least a first data pattern and a second data pattern; a control signal interface to transmit a control signal to the memory device, the control signal having an active state and an inactive state, the active state to be transmitted for a first period of time that is less than the clock period, transitions from the inactive state to the active state to have a phase relationship to the clock signal, the control signal to be sampled by the memory device on a first edge of the clock signal, a sampling of the control signal by the memory device in the active state to cause the memory device to provide a received data pattern, received via the memory device command/address interface to the controller; and control signal training circuitry to adjust the phase relationship to the clock signal through a plurality of phase relationships to, based on received data patterns provided to the controller by the memory device, determine a first phase relationship setting for the transitions from the inactive state to the active state.

Example 2: The controller of example 1, further comprising: command/address training circuitry to adjust command/address signal phase relationships of a plurality of command/address signals to the clock signal, the command/address signal phase relationships to be adjusted while the controller is using the first phase relationship setting for the control signal.

Example 3: The controller of example 2, wherein the command/address signal phase relationships are to be adjusted after the first phase relationship setting is determined.

Example 4: The controller of example 1, wherein the first period of time is substantially one-half the clock period.

Example 5: The controller of example 1, wherein the first data pattern and the second data pattern are transmitted at least one clock cycle before the control signal transitions from the inactive state to the active state.

Example 6: The controller of example 1, wherein the memory device is compatible with a GDDR6 standard.

Example 7: The controller of example 6, wherein the control signal is a CKE signal of the GDDR6 standard.

Example 8: A training method for a memory system, comprising: transmitting, by a controller and to a memory device, a clock signal having a clock signal period; transmitting, by the controller and to a device command/address interface of the memory device and via a controller command/address interface, at least a first data pattern and a second data pattern; transmitting, by the controller and to the memory device, a plurality of activations of a control signal, each activation of the plurality of activations having one of a plurality of phase relationships to the clock signal, the plurality of activations of the control signal to be activated for time periods that are less than the clock signal period, a first subset of the plurality of activations of the control signal causing the memory device to transmit data patterns received via the device command/address interface to the controller, a second subset of the plurality of activations of the control signal not causing the memory device to transmit data patterns; and based on the first subset and the second subset, selecting an operating phase relationship between the clock signal and the control signal.

Example 9: The training method of example 8, wherein the time periods that are less than the clock signal period are substantially one-half the clock signal period.

Example 10: The training method of example 8, further comprising: after selecting the operating phase relationship between the clock signal and the control signal, training phase relationships between signals of the controller command/address interface and the clock signal.

Example 11: The training method of example 8, wherein selecting the operating phase relationship between the clock signal and the control signal further comprises: based on the first subset and the second subset, determining a first phase relationship that substantially centers a transition of the clock signal within time periods that are less than the clock signal period.

Example 12: The training method of example 8, wherein the first data pattern and the second data pattern are transmitted at least one clock cycle prior to activation of the control signal.

Example 13: The training method of example 8, wherein the memory device is compatible with a GDDR6 standard.

Example 14: The training method of example 13, wherein the control signal corresponds to a CKE signal of the GDDR6 standard.

Example 15: A controller, comprising: a clock interface to provide a clock signal to a memory device, the clock signal to have a clock period; a controller command/address interface to provide a plurality of data patterns to a memory device command/address interface of the memory device; a control signal interface to provide a control signal to a memory device control signal interface of the memory device; and the controller to transmit to the memory device a plurality of activations of the control signal, each activation of the plurality of activations having one of a plurality of phase relationships to the clock signal, the plurality of activations of the control signal to be activated for time periods that are less than the clock period, a first subset of the plurality of activations of the control signal to cause the memory device to transmit data patterns received via the memory device command/address interface to the controller, a second subset of the plurality of activation of the control signal to not cause the memory device to transmit data patterns, and based on the first subset and the second subset, the controller to select an operating phase relationship between the clock signal and the control signal.

Example 16: The controller of example 15, wherein the time periods that are less than the clock period are to be substantially one-half the clock period.

Example 17: The controller of example 15, wherein the controller is to, after selecting the operating phase relationship between the clock signal and the control signal, train phase relationships between signals of the controller command/address interface and the clock signal.

Example 18: The controller of example 15, wherein the controller is to, based on the first subset and the second subset, determine a first phase relationship that substantially centers a transition of the clock signal within time periods that are less than the clock period.

Example 19: The controller of example 15, wherein the data patterns are to be transmitted at least one clock cycle prior to activation of the control signal.

Example 20: The controller of example 15, wherein the memory device is compatible with a GDDR6 standard and the control signal corresponds to a CKE signal of the GDDR6 standard.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A controller, comprising:

a clock interface to transmit a clock signal having a clock period;

a controller command/address interface to transmit, to a memory device command/address interface of a memory device, at least a first data pattern and a second data pattern;

a control signal interface to transmit a control signal to the memory device, the control signal having an active state and an inactive state, the active state to be transmitted for a first period of time that is less than the clock period, transitions from the inactive state to the active state to have a phase relationship to the clock signal, the control signal to be sampled by the memory device on a first edge of the clock signal, a sampling of the control signal by the memory device in the active state to cause the memory device to provide a received data pattern, received via the memory device command/address interface to the controller; and control signal training circuitry to adjust the phase relationship to the clock signal through a plurality of phase relationships to, based on received data patterns provided to the controller by the memory device, determine a first phase relationship setting for the transitions from the inactive state to the active state.

2. The controller of claim 1, further comprising:

command/address training circuitry to adjust command/address signal phase relationships of a plurality of command/address signals to the clock signal, the command/address signal phase relationships to be adjusted while the controller is using the first phase relationship setting for the control signal.

3. The controller of claim 2, wherein the command/address signal phase relationships are to be adjusted after the first phase relationship setting is determined.

4. The controller of claim 1, wherein the first period of time is substantially one-half the clock period.

5. The controller of claim 1, wherein the first data pattern and the second data pattern are transmitted at least one clock cycle before the control signal transitions from the inactive state to the active state.

6. The controller of claim 1, wherein the memory device is compatible with a GDDR6 standard.

7. The controller of claim 6, wherein the control signal is a CKE signal of the GDDR6 standard.

8. A training method for a memory system, comprising:

transmitting, by a controller and to a memory device, a clock signal having a clock signal period;

transmitting, by the controller and to a device command/address interface of the memory device and via a controller command/address interface, at least a first data pattern and a second data pattern;

transmitting, by the controller and to the memory device, a plurality of activations of a control signal, each activation of the plurality of activations having one of a plurality of phase relationships to the clock signal, the plurality of activations of the control signal to be activated for time periods that are less than the clock signal period, a first subset of the plurality of activations of the control signal causing the memory device to transmit data patterns received via the device command/address interface to the controller, a second subset of the plurality of activations of the control signal not causing the memory device to transmit data patterns; and based on the first subset and the second subset, selecting an operating phase relationship between the clock signal and the control signal.

9. The training method of claim 8, wherein the time periods that are less than the clock signal period are substantially one-half the clock signal period.

10. The training method of claim 8, further comprising:

after selecting the operating phase relationship between the clock signal and the control signal, training phase relationships between signals of the controller command/address interface and the clock signal.

11. The training method of claim 8, wherein selecting the operating phase relationship between the clock signal and the control signal further comprises:

based on the first subset and the second subset, determining a first phase relationship that substantially centers a transition of the clock signal within time periods that are less than the clock signal period.

12. The training method of claim 8, wherein the first data pattern and the second data pattern are transmitted at least one clock cycle prior to activation of the control signal.

13. The training method of claim 8, wherein the memory device is compatible with a GDDR6 standard.

14. The training method of claim 13, wherein the control signal corresponds to a CKE signal of the GDDR6 standard.

15. A controller, comprising:

a clock interface to provide a clock signal to a memory device, the clock signal to have a clock period;

a controller command/address interface to provide a plurality of data patterns to a memory device command/address interface of the memory device;

a control signal interface to provide a control signal to a memory device control signal interface of the memory device; and the controller to transmit to the memory device a plurality of activations of the control signal, each activation of the plurality of activations having one of a plurality of phase relationships to the clock signal, the plurality of activations of the control signal to be activated for time periods that are less than the clock period, a first subset of the plurality of activations of the control signal to cause the memory device to transmit data patterns received via the memory device command/address interface to the controller, a second subset of the plurality of activation of the control signal to not cause the memory device to transmit data patterns, and based on the first subset and the second subset, the controller to select an operating phase relationship between the clock signal and the control signal.

16. The controller of claim 15, wherein the time periods that are less than the clock period are to be substantially one-half the clock period.

17. The controller of claim 15, wherein the controller is to, after selecting the operating phase relationship between the clock signal and the control signal, train phase relationships between signals of the controller command/address interface and the clock signal.

18. The controller of claim 15, wherein the controller is to, based on the first subset and the second subset, determine a first phase relationship that substantially centers a transition of the clock signal within time periods that are less than the clock period.

19. The controller of claim 15, wherein the data patterns are to be transmitted at least one clock cycle prior to activation of the control signal.

20. The controller of claim 15, wherein the memory device is compatible with a GDDR6 standard and the control signal corresponds to a CKE signal of the GDDR6 standard.

* * * * *